(12) United States Patent
Yamada et al.

(10) Patent No.: US 8,503,249 B2
(45) Date of Patent: *Aug. 6, 2013

(54) SEMICONDUCTOR MEMORY COLUMN DECODER DEVICE AND METHOD

(75) Inventors: Shigekazu Yamada, Tokyo (JP); Tomoharu Tanaka, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/194,813

(22) Filed: Jul. 29, 2011

(65) Prior Publication Data

US 2011/0286282 A1     Nov. 24, 2011

Related U.S. Application Data

(63) Continuation of application No. 12/008,417, filed on Jan. 10, 2008, now Pat. No. 8,000,151.

(51) Int. Cl.
    *G11C 11/34*      (2006.01)
    *G11C 16/04*      (2006.01)

(52) U.S. Cl.
    USPC ............. 365/185.27; 365/185.17; 365/185.29

(58) Field of Classification Search
    USPC .......................... 365/185.25, 185.27, 185.29
    See application file for complete search history.

(56) References Cited

U.S. PATENT DOCUMENTS

| | | | |
|---|---|---|---|
| 5,473,563 | A | 12/1995 | Suh et al. |
| 5,610,859 | A | 3/1997 | Nakamura et al. |
| 5,801,989 | A | 9/1998 | Lee et al. |
| 6,927,990 | B2 | 8/2005 | Mukai |
| 2008/0123434 | A1 | 5/2008 | Kuriyama et al. |

FOREIGN PATENT DOCUMENTS

JP     08-046159     2/1996

*Primary Examiner* — Alexander Sofocleous
*Assistant Examiner* — Lance Reidlinger
(74) *Attorney, Agent, or Firm* — Dorsey & Whitney LLP

(57) ABSTRACT

Semiconductor memory devices and methods include a flash memory cell array fabricated in a well, with memory cells in the same column connected to each other in series and connected to a respective bit line. The memory devices also include a column decoder, a data register buffer unit, a row decoder, an erase control unit, and an input/output buffer unit. In one or more embodiments, the erase control unit applies voltages to the well to erase the memory cells in a manner that avoids breaking down p-n junctions formed by transistors fabricated in the well. In another embodiment, high voltage transistors are used to selectively isolate the bit lines from and couple the bit lines to a peripheral circuit in pairs so that each high voltage transistor is shared by two bit lines.

23 Claims, 23 Drawing Sheets

SEMICONDUCTOR MEMORY COLUMN DECODER DEVICE AND METHOD

CROSS-REFERENCE TO RELATED APPLICATION

This application is a continuation of U.S. patent application Ser. No. 12/008,417, filed Jan. 10, 2008, U.S. Pat. No. 8,000,151. This application is incorporated by reference herein in its entirety and for all purposes.

TECHNICAL FIELD

The present invention relates to a semiconductor memory device and, in particular, to a technique for making it more compact and more highly integrated.

BACKGROUND

Associated with the rapid progress of semiconductor circuit integration techniques and the development of a higher integration of semiconductor elements, the technological revolution for semiconductor memory devices has been attempting to attain a larger capacity and further miniaturization. Particularly for flash memory devices, so-called chip shrinkage for decreasing chip size by means of an ultra-fine process techniques has been in progress. In particular, these ultra-fine process techniques have permitted decreasing the area of a arrays of memory cells each of which may store a respective bit.

Despite progress that has been made in decreasing the area of memory cell arrays, there remains a problem with decreasing the area of a column decoder connected to memory cell arrays for controlling data input to and output from the array.

In the flash memory depicted in FIG. 1, when an erase operation is being carried out to erase data in memory cells, the voltage of a control gate 101 of a selected memory cell is decreased to zero volts, and an erase voltage of approximately twenty volts is then usually applied to the entirety of a well 102 in which a memory cell array is placed. This causes any electrons accumulated in the floating gate of the selected memory cell to discharge to the well by virtue of a tunnel effect. While such an erase operation is being carried out, gates of transistors 104, 105, 106 and 107 sharing the well are maintained at the same potential. Therefore, a high voltage transistor need not be used for the transistors 104, 105, 106 and 107. This in turn makes it possible to design the cell array unit with a smaller pitch pattern and to have the thickness of a thin film.

On the other hand, when the high erase voltage is applied to the well, a similar voltage is coupled to a digit line (often referred to as a bit line) that is used to couple the memory cell to sensing circuitry, such as sense amplifiers. Therefore, a high voltage transistor, which is typically part of a column decoder, is typically used to selectively couple a bit line with a periphery circuit, such as a sense amplifier, to isolate the peripheral circuit from this difference of potentials. A high voltage transistor has a large film thickness and large gate length, resulting in a large size, and therefore it is very difficult to reduce the size of the column decoder beyond a certain area.

Furthermore, associated with the progress of chip shrinkage aiming at larger capacities of flash memory, there is a trend for the pitch pattern of bit lines to be ever narrower. While bit line intervals between the column decoder and cell array unit need to be equalized, there is a process difficulty in employing lithography in the semiconductor production process because the column decoder transistor in the column decoder is large, as described above.

A short-circuiting in such a column decoder is a large factor causing pitch failures in the conventional flash memory production devices. This problem has been solved to some extent, but some problems remain. For example, as shown in FIG. 1, a source line is fabricated in the well 102 as indicated by the arrow in the drawing. The control gate 101 of the selected memory cell is set to zero volts, that is, the row lines (often referred to as word lines) in a block of the memory array selected for erase are set to zero volts, and an erase voltage, such as 20 volts, is applied to the well 102. This event causes a control gate 103 of an unselected memory cell to be in a floating state. As a result, the voltage at each gate of a row select transistor 104, a drain select transistor 105, a first column decoder transistor 106 and second column decoder transistor 107 increases to twenty volts due to a coupling phenomenon with the well 102. This is followed by grounding the well 102 to decrease the erase voltage as shown in the lower row of FIG. 1.

In the step of decreasing the erase voltage, a breakdown phenomenon can occur in the p-n junction. The first column decoder transistor 106 and the second column decoder transistor 107 are in an Off state to protect the periphery, which causes the p-n junction part on the well to be reversely biased because the electrons in the bit line are not discharged by way of the bit line. At the time of the occurrence of the breakdown phenomenon, a reverse voltage is generated to the respective gates of the source select transistor 104, drain select transistor 105, first column decoder transistor 106, and second column decoder transistor 107, which are put in the floating state, thus resulting in applying a high voltage (e.g., a reverse voltage) stress. A breakdown of the p-n junction part of each transistor on the well accompanies the reverse voltage, thereby decreasing the voltage of the bit line. Considering that the flash memory is actually used in repetitions of data writings and erasures, a reduction of voltage through breakdowns causes a very high possibility of damage to the flash memory device.

DETAILED DESCRIPTION

Figure 1:
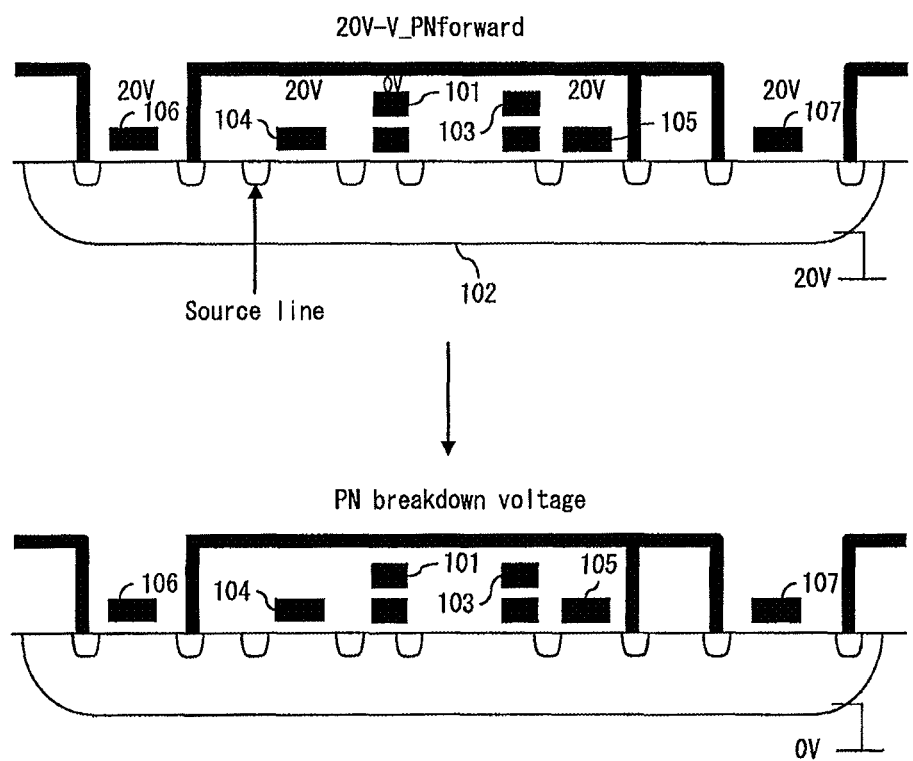
FIG. 1 is a cross-section of a portion of a prior art flash memory array showing a problem that can occur when erasing data stored in memory cells in the array.
Figure 2:
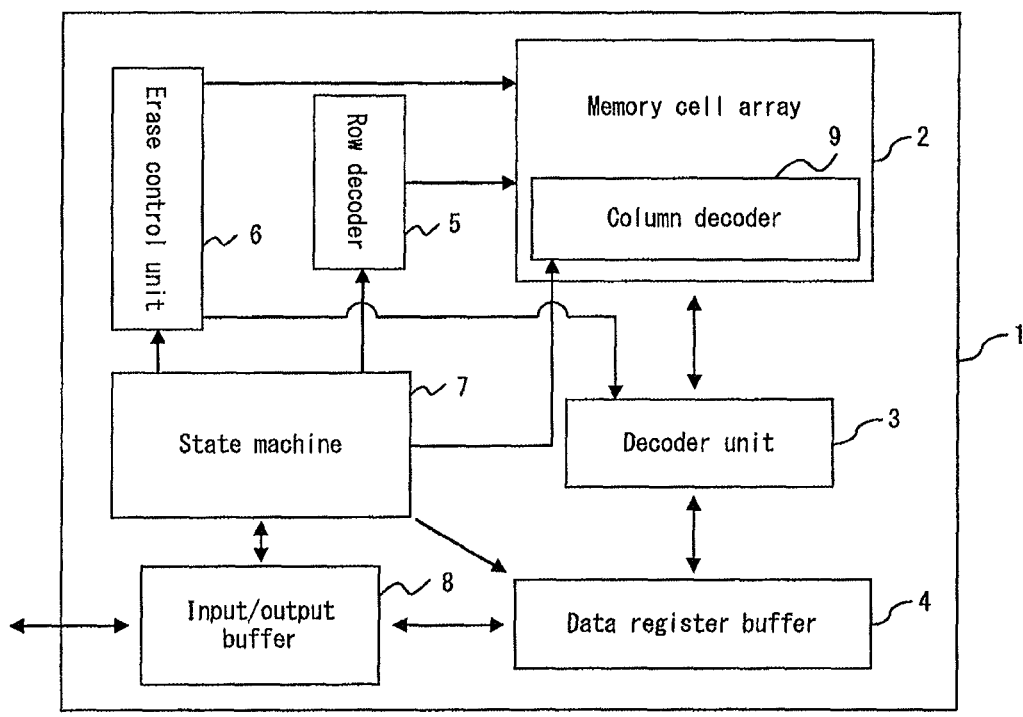
FIG. 2 is a block diagram of a semiconductor memory device according to an embodiment of the invention.

FIG. 2 is a block diagram of a semiconductor memory device according to an embodiment of the invention. The memory device is, in this example, a flash memory device having a memory cell array 2, a decoder unit 3, a data register buffer 4, a row decoder 5, an erase control unit 6, a state machine 7, and an input/output buffer 8. The state machine 7 may be, for example, a controller.

The memory cell array 2 includes a column decoder 9, such as a column decoder. The column decoder may be fabricated in a well in which the memory cell array is fabricated.

An address to a memory device containing the array 2 is divided into a row address and a column address. The row decoder 5 decodes the row address and selects the row of the selected memory cell (i.e., all memory cells connected to the row). The column decoder 9, which could be part of a column decoder, decodes the column address to select a bit line so that the data on the bit line is sent to the data register buffer 4.

The data register buffer 4 may include a sense amplifier for sensing the voltage of a bit line, and may temporarily store data, being written to, or read from, the memory array 2.

The decoder unit 3 may include a high voltage transistor. The decoder 3 may shut off an erase voltage coupled to a bit line in the array 2 to prevent a high voltage from being applied to a peripheral circuit, such as the data register buffer 4 during an erase operation. As explained above, a high voltage could be applied to a peripheral circuit when an erase voltage is applied to the well for erasing the data of a memory cell within the memory cell array unit 2. The decoder unit 3 may also have the function of controlling a voltage applied to a bit line when erasing data.

The erase control unit 6 controls the memory cell array unit 2 and decoder unit 3, and may perform various control functions including performing a control in the event of discharging a bit line when erasing data stored in the memory cell array unit 2.

The state machine 7 controls the decoder unit 3, the data register buffer 4, the row decoder 5, the column decoder 9 and the erase control unit 6, and manages the memory cell array unit 2.

In the event that data is input and output between the flash memory device 1 and an external process apparatus, the input/output buffer unit 8 exchanges data with the data register buffer 4 and exchanges information expressing the state of inputs and outputs with the state machine 7.

The following is a description of data read and write operations. First, in a read operation, a row address is decoded by the row decoder 5, and a row line (often referred to as a word line) of a memory cell (e.g., all memory cells connected to the line) is selected. A value encoded for the output of each column in the selected row is detected by the respective sense amplifiers in the data register buffer 4 by way of the respective bit lines. Further, the column address is decoded by the column decoder 9. Sense amplifiers are selected on the basis of the output of the column decoder 9, and data are supplied to the column decoder 9 from the selected sense amplifiers. The column data supplied to the data register buffer 4 is output to an external process apparatus by way of the input/output buffer unit 8.

In a write operation, a word line is selected by the row decoder 5, and a write sense amplifier is selected by the column decoder 9. The data to be written is written to a memory cell selected in the memory cell array unit 2 from the data register buffer 4 by way of the write sense amplifier selected by the column decoder 9.

An erase control operation is described in detail later by referring to FIGS. 7 through 12.

Figure 3:
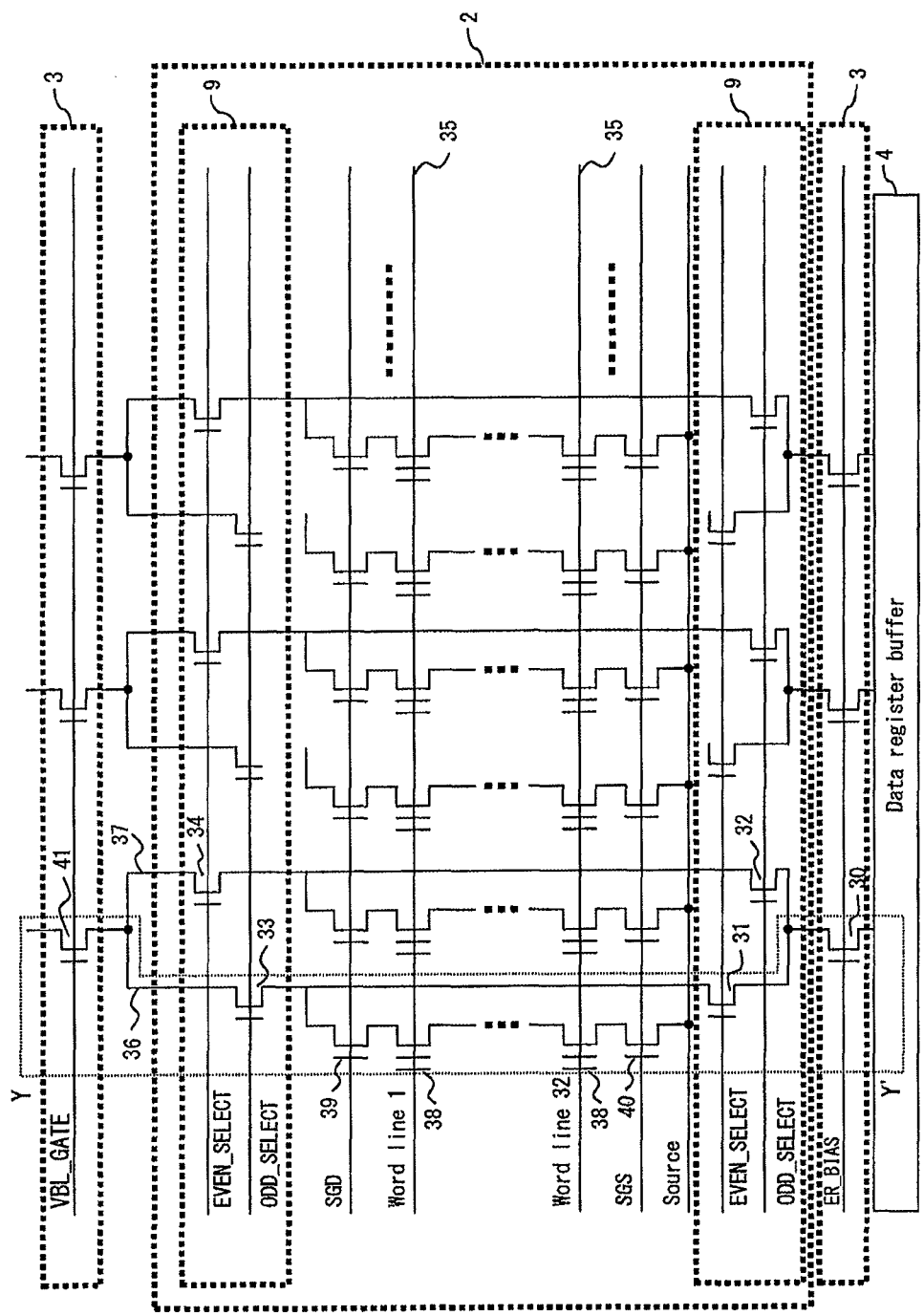
FIG. 3 is a simplified diagram of a memory cell array of flash memory according to an embodiment of the invention.
Figure 4:
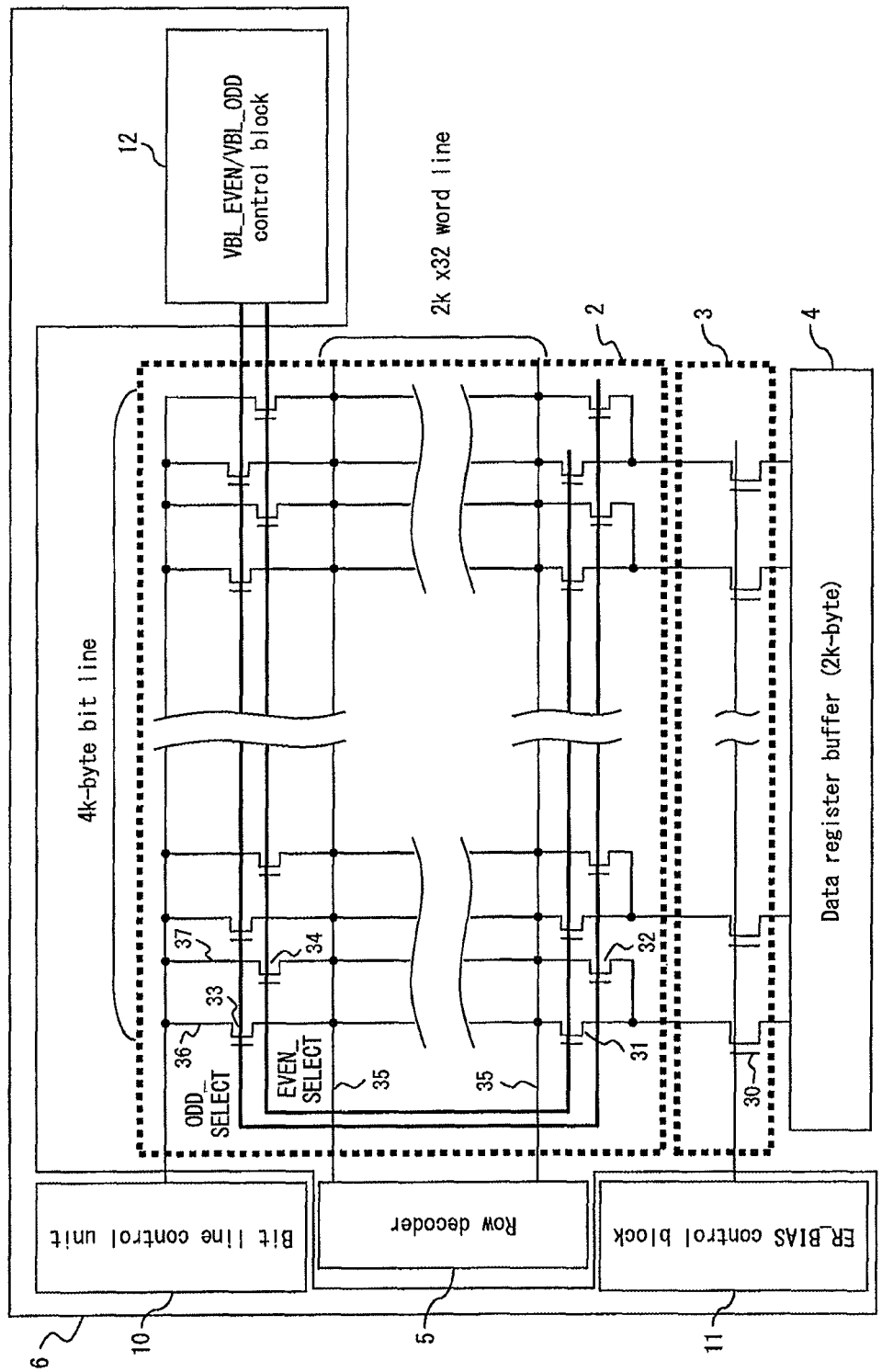
FIG. 4 is a diagram showing an a memory cell array and column decoder according to an embodiment of the invention.

FIG. 3 is a simplified diagram of the memory cell array 2 of the flash memory 1 according to an embodiment of the present invention. FIG. 4 is a diagram showing an outline configuration of the memory cell array 2 and the decoder unit 3 according to an embodiment of the present invention. The embodiment of FIGS. 3 and 4 is configured such that a memory cell transistor 38 within the memory cell array unit has a source/drain and a channel forming zone and includes a floating gate and a control gate. In the memory cell array 2, an array of the memory cell transistor 38 is arrayed in a matrix so that the individual floating gates of a 2 k-byte memory cell transistor 38 are connected to thirty-two word lines 35 in respective rows. For each memory cell transistor 38, the respective drains or sources are connected to the bit lines. As such, each memory cell transistor 38 forms a NAND logic structure.

A bit line assigned an even number (noted as "even-numbered bit line" hereinafter) is selected by a column decoder transistor 31. The column decoder transistor 31 is controlled by a signal EVEN_SELECT for selecting a state of a bit line, which couples even-numbered columns to respective bit lines. Similarly, a bit line assigned an odd number (noted as "odd-numbered bit line" hereinafter) is selected by a column decoder transistor 32 controlled by a signal ODD_SELECT to connect odd-numbered columns to respective bit lines. The even-numbered bit line 36 and odd-numbered bit line 37 in each column are connected to a respective high voltage transistor 30 of the decoder unit 3 so as to share one sense amplifier and one data register circuit of the data register buffer 4.

Also, the memory cell array 2 includes a drain select transistor (Select Gate Drain (SGD)) 39 and a source select transistor (Select Gate Source (SGS)) 40. The drain select transistor and source select transistor are usually placed on respective ends of a connected series of memory cells (e.g., a memory cell string). These two are sometimes called select transistors. Of the two, the transistor connected to the source is called a source select transistor, and the other transistor is called a drain select transistor. These two transistors are turned ON during a read and a write operation.

In the NAND type flash memory, lead lines necessary for driving a memory cell are shared by a plurality of memory cells. Therefore, a data write and read are performed in units of columns. A single column is a unit that consists of plural cells. The terms odd-numbered page or even-numbered columns express those memory cells in a row of memory cells connected to respective odd-numbered bit lines or even-numbered bit lines, respectively.

As an example, when reading data from an even-numbered bit line 36, the first column decoder transistor 31 is turned ON by a signal EVEN_SELECT for controlling an even-numbered page, and the even-numbered bit line 36 is connected to the data register buffer 4. The EVEN_SELECT signal also turns ON the column decoder transistor 34 to couple zero volts to the odd-numbered bit line 37 through a high voltage transistor 41, which is turned ON by a VBL_GATE signal. The When data is written to (i.e., programmed in) a memory cell connected to the even-numbered bit line 36, for example, the first column decoder transistor 31 is turned ON by the signal EVEN_SELECT to connect the even-numbered bit line 36 to the data register buffer 4. The EVEN_SELECT signal also turns ON the second column decoder transistor 34 to connect the odd-numbered bit line 37 to Vcc thorough the high voltage transistor 41. This makes it possible to write the data appropriately to the even-numbered bit line 36 without writing data to the odd-numbered bit line 37.

The first and second column decoder transistors 31, 32, 33 and 34 are each an n-type Metal Oxide Semiconductor (NMOS) transistor that is formed on a well of the memory cell array 2. The well is formed from a p-type semiconductor zone and an n-type semiconductor zone. Control gates of the transistors 31-34 are typically polysilicon. The first column decoder transistors 31 and 32, and the second column decoder transistors 33 and 34 for each bit line are connected in series with the memory cell transistors 38. The column decoder transistors 31, 32, 33 and 34 are NMOS transistors of the same form and size as the source select transistor 40 and drain select transistors 39, also with the same voltage characteristics and resistance. The column decoder transistors 31, 32, 33 and 34 also have the same size, and the same voltage characteristics and resistance, as the transistors of the respective memory cell transistor 38. This configuration makes it possible to form the column decoder transistors 31, 32, 33 and 34 at the same time, in the same size, and in the same well as the source select transistor 40, drain select transistor 39, and memory cell transistors 38, bringing forth the benefit of saving time in the design and production processes. Note that a pre-charge current through the column decoder transistors 31, 32, 33 and 34 when a bit line is selected is very small, that is, one the order of one microampere. Therefore, there is no problem in fabrication the column decode transistors 31, 32, 33 and 34 in the same manner as the source select transistor 40, drain select transistor 39, and memory cell transistor 38.

The decoder unit 3 includes a high voltage transistor 30 and a high voltage transistor 41. The high voltage transistor 30, being controlled by an ER_BIAS, performs, as a transistor for separation, the function of shutting off a voltage for preventing an application of an erase voltage to a peripheral circuit that includes the data register buffer 4 when the erase voltage is applied to the well in order to, for instance, erase the data. Further, the high voltage transistor 41, being controlled by a VBL_GATE, carries out the function of performing a switching control in the event of applying a voltage to a bit line in order to, for instance, erase the data.

Note that the respective gates of the column decoder transistors 31, 32, 33 and 34, the respective gates of the high voltage transistors 30 and 41, and the wells and bit lines are controlled by the erase control unit 6.

In contrast to the conventional design process in which the first and second column decoder transistors 31-34 are designed as high voltage transistors, the present embodiment is contrived to equip two bit line strings (e.g., an even-numbered bit line and an odd-numbered bit line) with only two high voltage transistors 30, 41, that is, one transistor for one bit line string. As an example, in the case of having bit lines of 4 k bytes as the total of odd-numbered and even-numbered lines, the conventional design requires 8 k bytes (=4 k bytes times two) of the high voltage transistors, whereas the configuration according to the present embodiment reduces it to half that, that is, only 4 k bytes of high voltage transistors. Such a configuration reduces the number of high voltage transistors equipped for one bit line string to half of the original, providing more room for a larger array or a smaller chip area for an array of a given size. It also makes it possible to reduce the bit line interval of a semiconductor memory device, thereby enabling further miniaturization and a higher integration. Also enabled by a provision of more room for lithography is a large reduction in a failure ratio such as short-circuiting which has conventionally occupied a good part of pitch failure.

With further reference to FIG. 3, the data register buffer 4 includes a sense amplifier for each column of the array 2. The even-numbered bit line 36 and the odd-numbered bit line 37 for each column share a common sense amplifier in the data register buffer 4.

The erase control unit 6 placed in the neighborhood of the memory cell array unit 2 will now be explained with reference to FIG. 4. The erase control unit 6, includes a bit line control unit 10, an ER_BIAS control unit 11, and a VBL_EVEN/VBL_ODD control unit 12, which are used to perform various function in erasing the data stored in the memory cell array 2.

The bit line control unit 10 together with the VBL_BIAS control unit 12 controls a voltage applied to a bit line controls for retaining (e.g., clamping) an erase voltage at a certain value when the bit line voltage is decreased following erase. The ER_BIAS control unit 11 controls a voltage (ER_BIAS) applied to the high voltage transistor 30 of the decoder unit 3 in the event of erasing the data. The VBL_EVEN/VBL_ODD control block 12 controls a voltage (VBL_ODD and VBL_EVEN) applied to a column decoder transistor in the event of erasing the data.

Note that the present embodiment is configured to set the string length of a memory cell to "32", that is, the number of word lines to "32" strings, as an example. It also sets the number of bit lines to 4 k bytes as a total of the even-numbered bit lines and odd-numbered bit lines, which are 2 k bytes each. The number of memory cells, the number of word lines and/or the number of bit lines of the flash memory array 2 that is memory device 1 may be changed in accordance with a desired storage capacity. Also, although the present embodiment exemplifies the case of forming the memory cell array 2 as a NAND structure, other structures may be used.

Furthermore, the present embodiment exemplifies the case of each constituent component being an NMOS transistor formed in a p-type well. The well and transistor may be PMOS transistors formed on an n-type well, however. Also, the transistors included in the decoder unit 3, data register buffer unit 4 and erase control unit, although exemplified by NMOS transistors, may be PMOS transistors.

Figure 5:
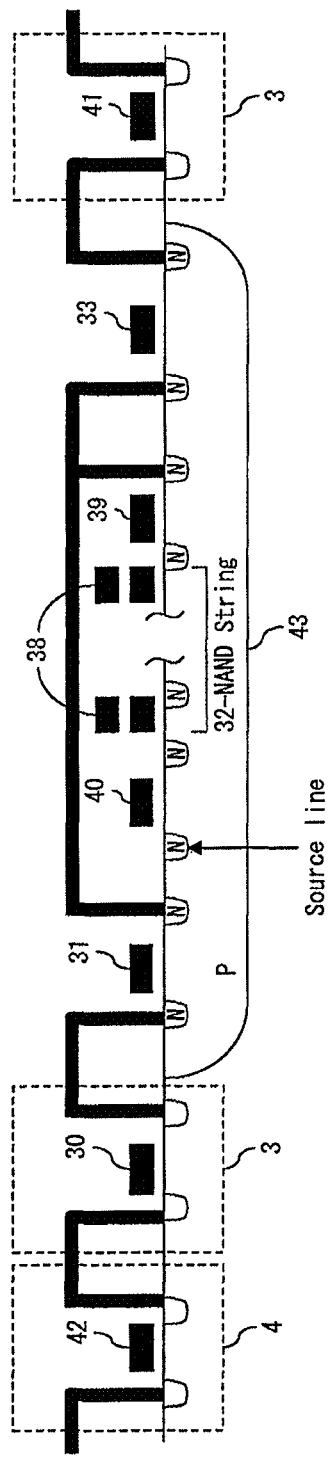
FIG. 5 is a cross section of a portion of a of flash memory array according to an embodiment of the invention.

FIG. 5 is a cross section of a portion of the flash memory device 1 according to an embodiment of the present invention. More specifically, FIG. 5 shows a portion of the memory cell array 2, decoder unit 3 and data register buffer 4, which are shown in FIG. 3. As shown in FIG. 5, the bit line shown in the drawing is the even-numbered bit line 36, indicating, from left to right, a transistor 42 within the data register buffer 4, the high voltage transistor 30 within the decoder unit 3, the first column decoder transistor 31 controlled by a signal EVEN_SELECT for controlling an even-numbered page, the source select transistor 40, the memory cell transistors 38, the drain select transistor 39, the second column decoder transistor 33 controlled by a signal ODD_SELECT for controlling an odd-numbered page, and the high voltage transistor 41 within the decoder unit 3. Note that the drawing herein shows only two memory cell transistors 38. Thirty-two memory cell transistors 38 are actually connected in the case of a 32-NAND type string. Further, a source line is connected to the source region of the source select transistor 40 as indicated by the arrow.

As shown in FIG. 5, the first column decoder transistor 31, source select transistor 40, memory cell transistors 38, drain select transistor 39 and second column decoder transistor 33 are all fabricated in the same well 43. Exemplified here is the case of forming these transistors as NMOS transistors on the p-type well.

In order to write "0" to a memory cell transistor 38, a high voltage is applied to the control gate of the memory cell transistor 38 with the drain and source being grounded. As a result, the electrons flowing in the channel attain a high energy state in the vicinity of the drain, and the electrons are therefore injected into the floating gate, thereby increasing the threshold voltage of the transistor 38 On the other hand, in order to write "1", the control gate is set to zero volts, and a high voltage (e.g., usually about twenty volts) is applied to the well 43. As a result, any electrons accumulated in the floating gate are extracted by virtue of a tunneling effect and the threshold voltage of the floating gate returns to the initial state. This state is also the erase state, so the same voltages can be used in an erase operation.

In a read operation, the drain select transistor 39 is turned ON, and a voltage of about 0.7 volts is usually applied to the control gate of a memory cell transistor 38 to be accessed by the row decoder through the respective word line. This is followed by turning the source select transistor 40 ON. If the selected memory cell is in the erase state of "1" in this event, a current flows and the voltage of the bit line decreases from, for example, 0.7 volts to zero volts.

In contrast, if the selected memory cell is in the program state of "0", the selected memory cell transistor 38 does not turn ON, so the charge accumulated on the bit line is not discharged. Therefore the voltage of the bit line is not decreased. Whether or not the voltage of the bit line is decreased is detected by the sense amplifier of the data register buffer 4, thus reading the data. The drain select transistor 39 and source select transistor 40 are also selectively turned ON to control the timing of the read operation.

Next is a description of a problem generated in the event of erasing the data stored in the memory cell transistor. When erasing the data stored in a memory cell transistor, the voltage of the control gate of transistor, that is, the voltage of the word line of the selected row, is set to zero volts and an erase voltage is applied to the well 43. As a result, the potentials of the respective gates of the source select transistor, drain select transistor, first column decoder transistor and second column decoder transistor and the bit lines are increased to the same voltage as the erase voltage due to capacitive coupling with the well 43. Then, the well is grounded for decreasing the erase voltage. In the step in which the erase voltage is decreased, a breakdown phenomenon occurs in a p-n junction.

In a breakdown phenomenon, a reverse direction bias voltage is applied to a p-n junction and a very small amount of reverse direction current flows in an actual device, despite the fact that theoretically no current is considered to flow. Moreover, with an increase in a reverse bias voltage, a reverse direction current starts to flow due to an occurrence of a yield phenomenon. This phenomenon is called a breakdown phenomenon, and the voltage in this event is called a breakdown voltage, which is usually about eight volts.

In the event of the breakdown phenomenon, a reverse voltage is applied to the p-n junction parts at the location of the p-type well area. The well area in which exist the source select transistor, drain select transistor, first column decoder transistor and second column decoder transistor that are put in the floating states remains at zero volts, and the n-type source or drain area of the gate and bit line remain at the potential of twenty volts due to a delay in time constant, thus resulting in the p-n junction parts having a high voltage applied to them. This causes the voltage of the p-n junction to exceed a breakdown voltage, resulting in decreasing the voltage of the bit line together with the destruction due to the breakdown phenomenon. Since the flash memory device may be repetitively used for writing and erasing data, a reduction of voltage by way of the breakdown phenomenon increases the risk of destruction.

Figure 6:
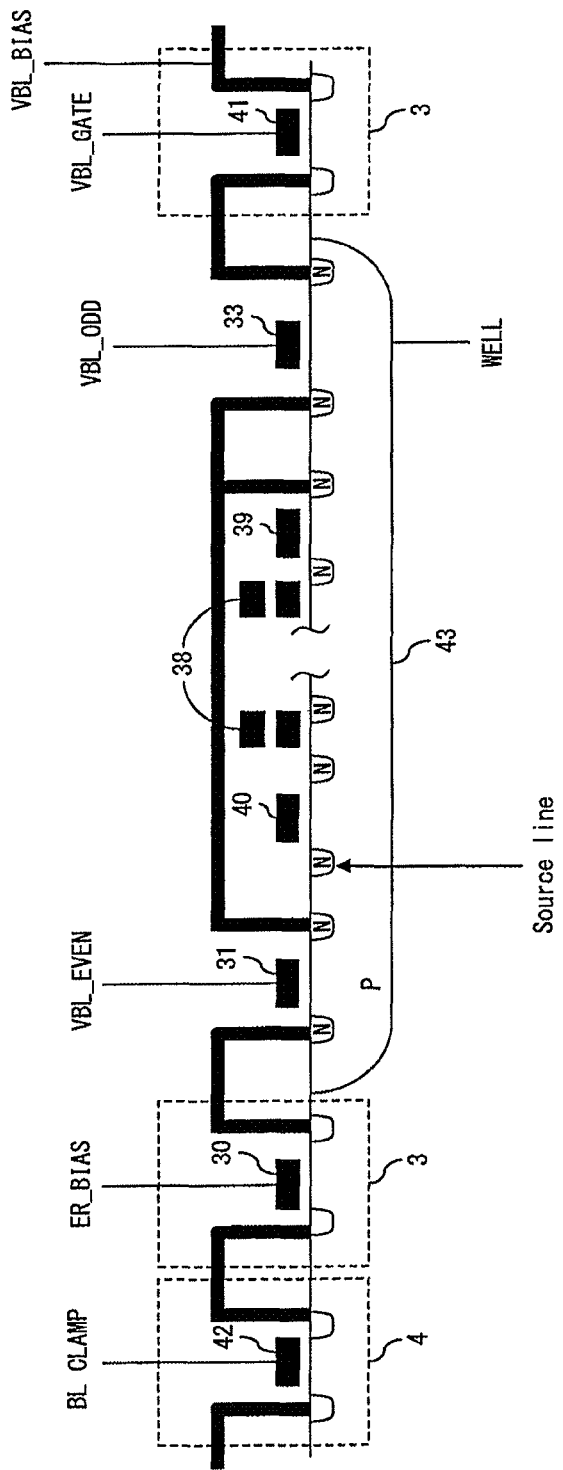
FIG. 6 is cross section of the portion of a of flash memory array shown in FIG. 5 annotated with voltages as an example of control signals that can be used for an erase operation according to an embodiment of the invention.

The breakdown problem may be avoided by an erase control method according to an embodiment of the invention. With reference to FIG. 6 in which the voltages used as control signals are shown, a BL CLAMP voltage is applied to the gate of a transistor 42 of the data register buffer 4. A ER_BIAS voltage is applied to the gate 30 of a high voltage transistor in the decoder unit 3. A VBL_EVEN voltage is applied to the gate of a column decoder transistor 31 for accessing an even-numbered column. An VBL_ODD voltage is applied to gate of a column decoder transistor 33 to control by the ODD_SELECT that is a signal for accessing an odd-numbered bit line. Note that FIG. 6 shows the case of an even-numbered bit line as one example, in which case the VBL_EVEN voltage is applied to the gate of the first column decoder transistor 31, while the VBL_ODD is a voltage applied to the gate of the second column decoder transistor 33. A VBL_GATE voltage is applied to the gate of the transistor 41 of the decoder unit 3 for controlling the voltage of the bit line 36. A VBL_BIAS is a voltage is applied to the bit line, and a WELL voltage is applied to the well 43.

Figure 7:
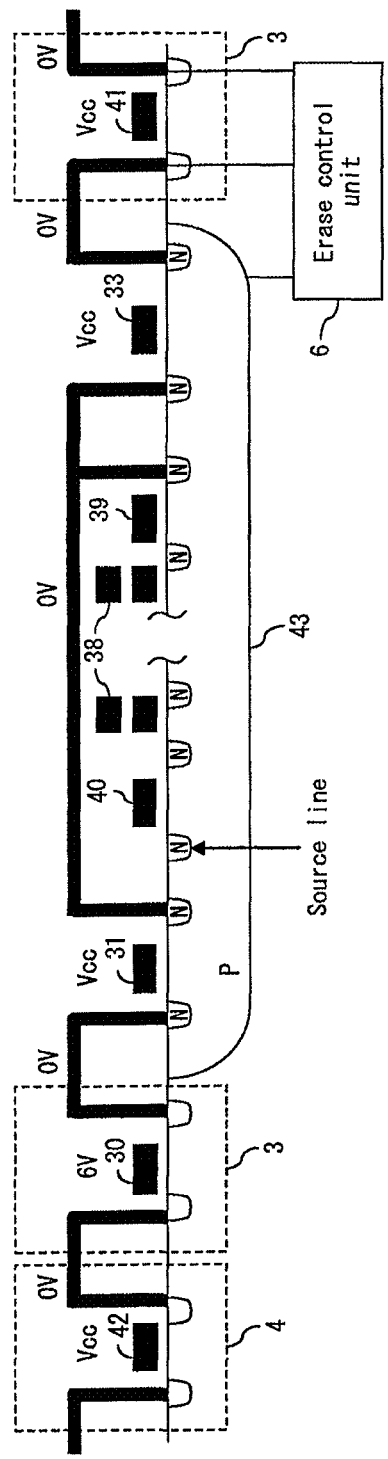
FIG. 7 is a cross section of the portion of a of flash memory array shown in FIG. 5 annotated with voltages initially applied for an erase operation according to an embodiment of the invention.

FIGS. 7 through 12 are diagrams respectively showing the first step through sixth step of the erase control method according to an embodiment of the present invention. FIG. 7 indicates the state of flash memory device in a standby state prior to applying an erase voltage. In this state, the bit line 36 is at zero volts, and Vcc is applied to the gates of the first column decoder transistor 31 and second column decoder transistor 33, thereby turning the respective transistors ON. Six volts, for example, is applied to the gate of the high voltage transistor 30 of the decoder unit 3, thereby turning ON the transistor 30. Further, Vcc is applied to the gate of the high voltage transistor 41 of the decoder unit 3, thereby turning the transistor 41 ON. Also Vcc is applied to the gate of the transistor 42 of the data register buffer 4, thereby also turning the transistor 42 ON.

Figure 8:
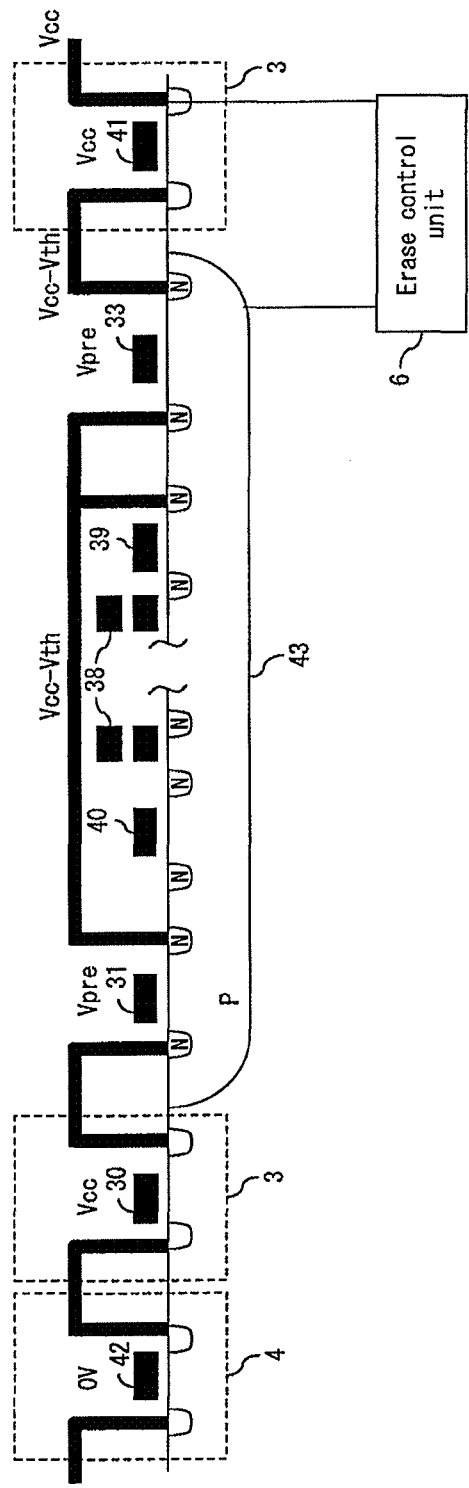
FIG. 8 is a cross section of the portion of a flash memory array shown in FIG. 5 annotated with a second set of voltages applied for an erase operation according to an embodiment of the invention.

In the second step shown in FIG. 8, a voltage of Vcc is applied to the bit line by the VBL_BIAS control unit 17. Here the Vcc applied to the gate of the high voltage transistor 41 in the first step has turned the transistor 41 ON so that the bit line 36 is charged with a voltage that is a result of subtracting a threshold voltage from the power supply voltage (e.g., Vcc−Vth), where Vth is the threshold voltage of a p-n junction between the well 43 and source or drain region. Also, a voltage Vpre which is higher than Vcc and adequately high for maintaining the first column decoder transistor 31 and second column decoder transistor 33 in the ON state during performance of the erase control, is applied to the gates of the aforementioned transistors. Here, the Vpre is assumed to be three volts, for instance.

Further, the Vcc, as an example, is applied to the gate of the high voltage transistor 30 of the decoder unit 3, thereby turning the transistor 30 OFF. Vcc is applied to turn OFF the high voltage transistor 30 because it is smaller than Vss+Vth and has smaller potential difference from the erase voltage than that of the Vss. This shuts off the erase voltage so that it is not applied to a peripheral circuit, e.g., a circuit within the data register buffer 4. Therefore, the voltage applied to the gate of the transistor 42 within the data register buffer 4 is, for example, decreased to zero volts in order to decrease power consumption.

Figure 9:
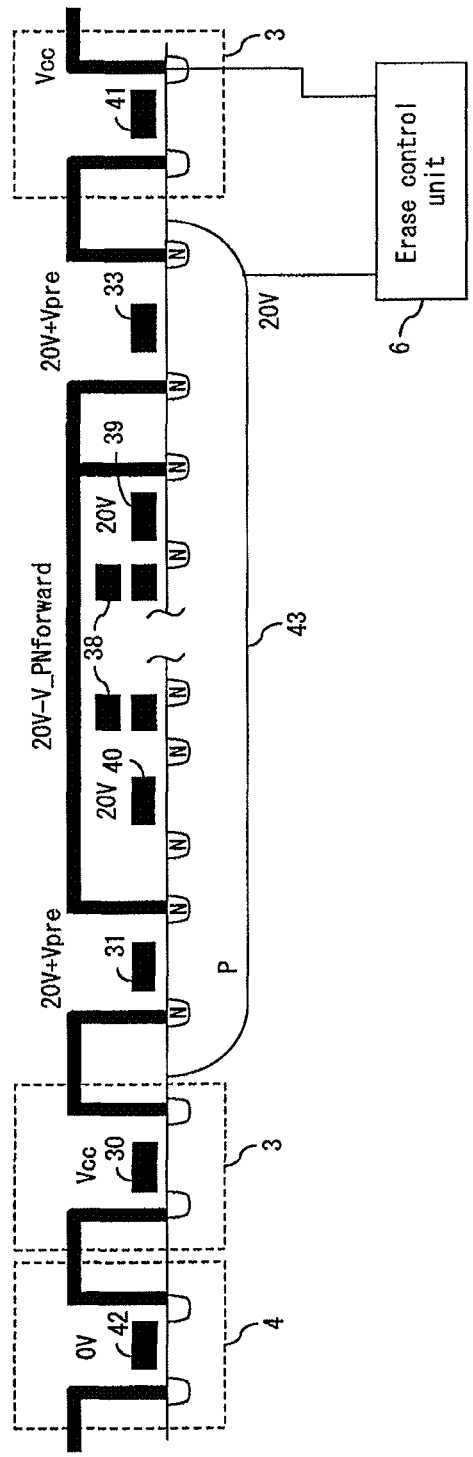
FIG. 9 is a cross section of the portion of a flash memory array shown in FIG. 5 annotated with a third set of voltages applied for an erase operation according to an embodiment of the invention.

In the third step shown in FIG. 9, the erase voltage is applied to the well 43 by the erase control unit 6. Here, the erase voltage is assumed to be twenty volts, for example. The application of the twenty volts causes the bit line 36 to be charged with a voltage that is a result of subtracting a forward direction voltage from the erase voltage (e.g., twenty volts−V_PN forward), where V_PN forward is the forward direction voltage of a p-n junction. Further, the respective gates of the source select transistor 40 and drain select transistor 39 climb to a potential of twenty volts by virtue of capacitive coupling from the well 43. The respective gates of the first column decoder transistor 31 and second column decoder transistor 33 then climb to a potential of twenty volts plus Vpre. In this example, the gates of the transistors 31, 33 climb to about 23 volts. The application of the erase voltage causes the electrons accumulated in the floating gate of the selected memory cell 38 to be extracted by a tunnel effect.

Figure 10:
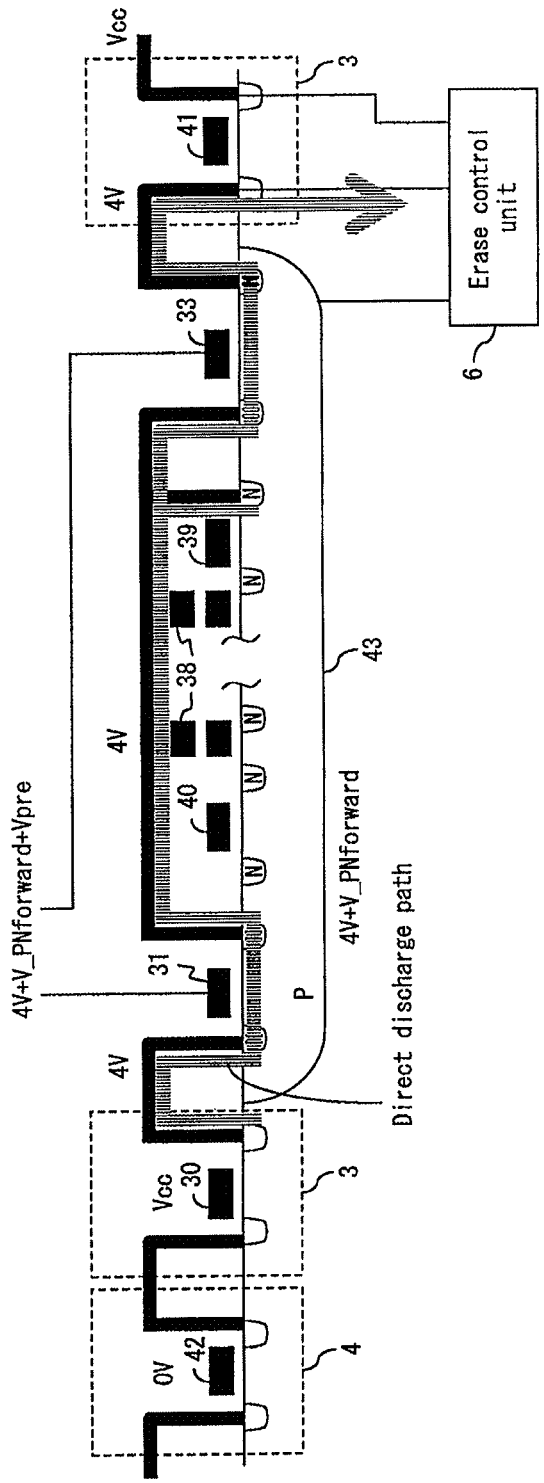
FIG. 10 is a cross section of the portion of a flash memory array shown in FIG. 5 annotated with a fourth set of voltages applied for an erase operation according to an embodiment of the invention.

In the fourth step shown in FIG. 10, the bit line control unit 10, which is coupled to the bit line 36, retains (e.g., clamps) the potential of the bit line at a certain voltage in the process of decreasing the potential. Here, the retained voltage via the operation of the discharge enable and the bit line control unit 10 is assumed to be four volts to avoid breaking down the transistors in the well by a stress of the reverse direction bias.

This causes the potential of the well 43 to only decrease to four volts plus V_PN forward. Further, the voltage at the respective gates of the column decoder transistors 31 and 33 is decreased to four volts plus V_PN forward plus Vpre (e.g., three volts) by virtue of a coupling phenomenon associated with the decrease of the potential of the well 43. Here, the difference in potentials between the bit line and well 43 is V_PN forward, which is less than the breakdown voltage and therefore a breakdown phenomenon of the p-n junction part does not occur. Also, the column decoder transistors 31 and 33 are maintained in the ON state, and therefore a current flows by way of the direct discharge path shown in FIG. 10, thereby making it possible to decrease the potential of the bit line by the bit line control unit 10.

Figure 11:
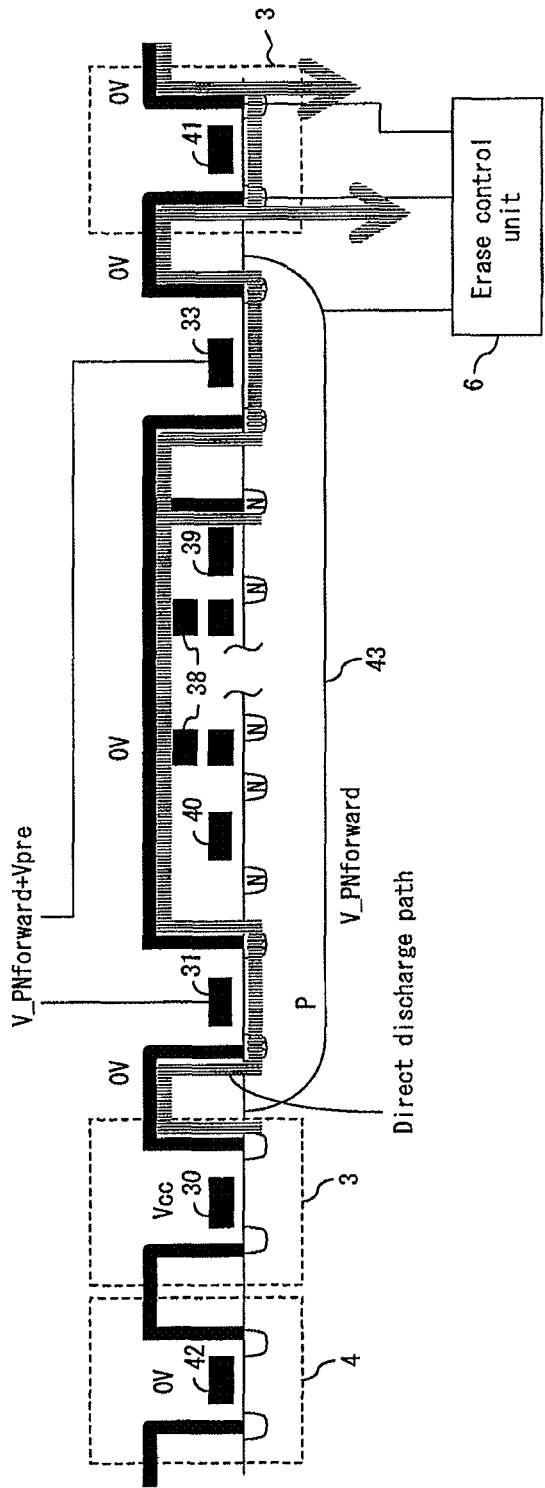
FIG. 11 is a cross section of the portion of a flash memory array shown in FIG. 5 annotated with a fifth set of voltages applied for an erase operation according to an embodiment of the invention.

In the fifth step shown in FIG. 11, the potential of the bit line 36 is decreased to zero volts by the bit line control unit 10. This causes the potential of the well 43 to decrease to V_PN forward. Further, the voltage applied to the respective gates of the column decoder transistors 31 and 33 is decreased to V_PN forward plus Vpre (e.g., three volts) by virtue of capacitive coupling with the reduced potential of the well 43. Here, the difference in potentials between the well and bit line is V_PN forward, which is less than the breakdown voltage and therefore a breakdown phenomenon of the p-n junction part does not occur. Also, the column decoder transistors 31 and 33 are maintained in the ON state, and therefore a current flows by way of the direct discharge path shown in FIG. 11, thereby making it possible to decrease the potential of the bit line. The direct discharge path shown in FIG. 11 is different from that shown in FIG. 10 because clamping the bit line by the bit line control unit 10 in the fourth step does not effect the bit line at Vcc. Further, the discharge process is divided into two steps (the fourth and fifth steps) because the potential difference between the well 43 and a component on the well (e.g., word line or bit line) should be small.

Figure 12:
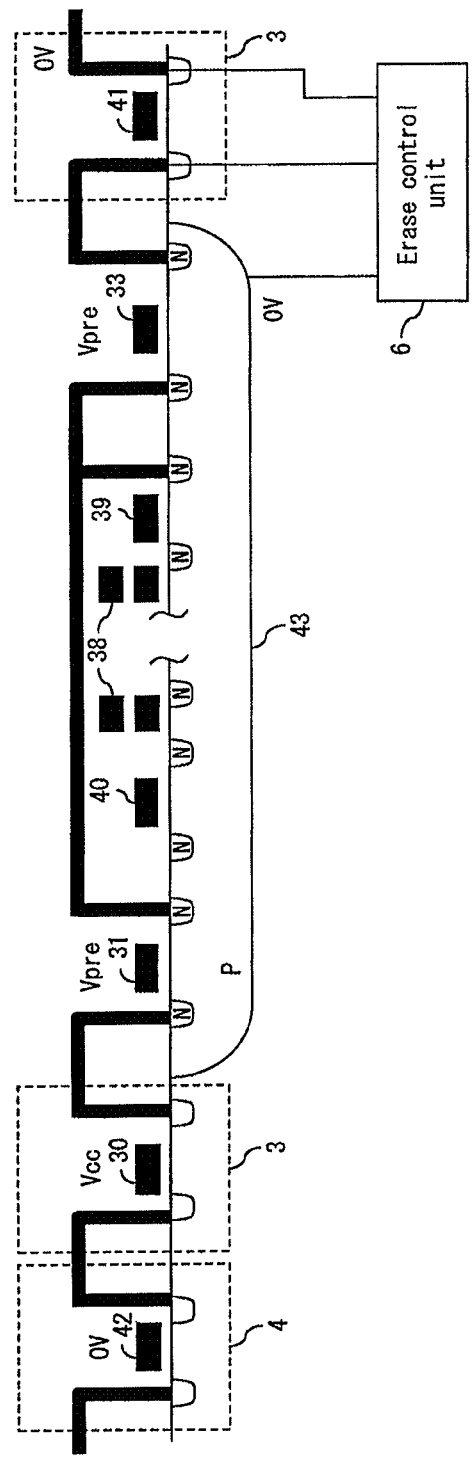
FIG. 12 is a cross section of the portion of a flash memory array shown in FIG. 5 annotated with a sixth set of voltages applied for an erase operation according to an embodiment of the invention.

In the sixth and final step shown in FIG. 12, the WELL control unit 21 applies a voltage of zero volts to the well 43 to perform a final discharge of the well 43. The voltage applied to the respective gates of the column decoder transistors 31 and 33 is decreased to Vpre (e.g., three volts) by virtue of capacitive coupling with the reduced potential of the well 43. However, the transistors 31, 33 remain ON from the start of the erase control to the completion and, therefore, they are not broken down by the stress of reverse direction bias. Note that the potentials of the respective gates of the drain select transistor 39 and source select transistor 40 are decreased by virtue of capacitive coupling with the well 43 starting from the fourth step, followed by finally being decreased to zero volts in the sixth step. The memory device then returns to the standby state shown in FIG. 6.

Figure 13:
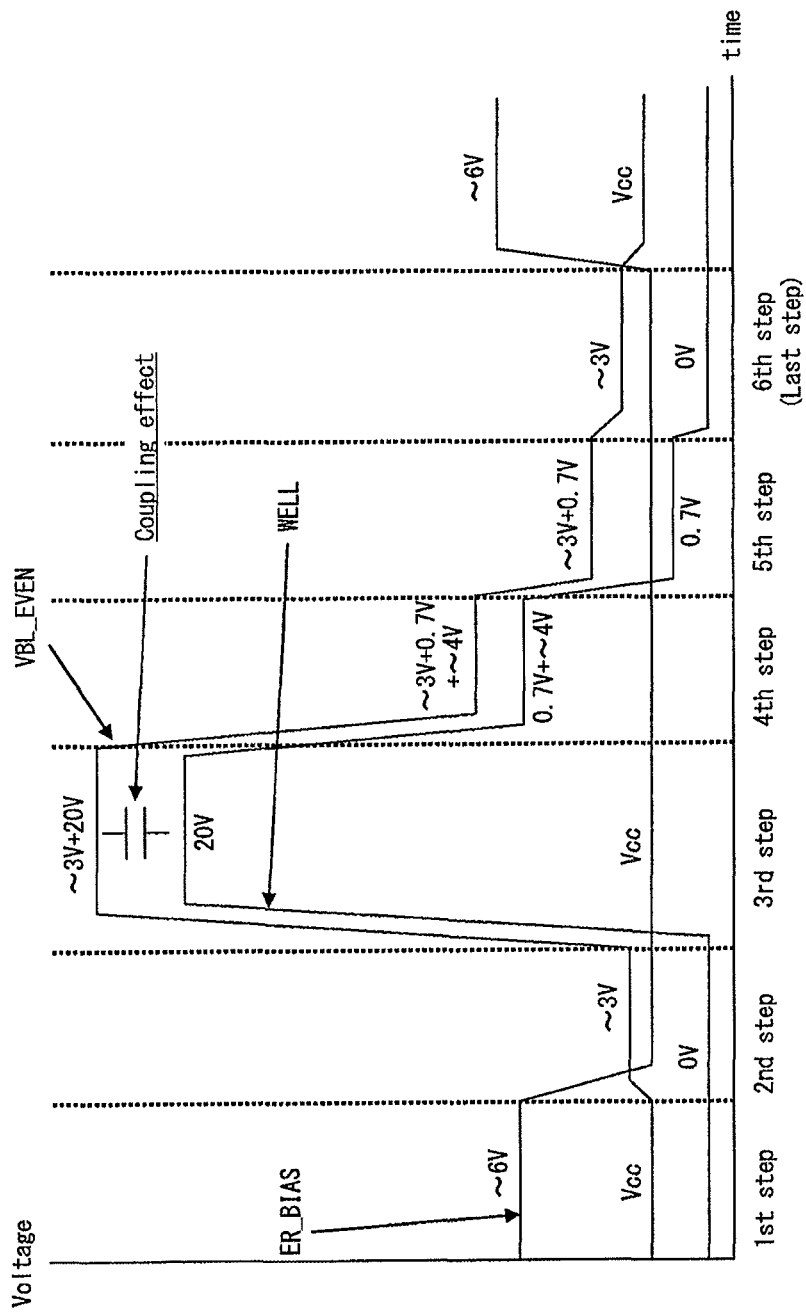
FIG. 13 is a timing diagram of various voltages applied to the portion of the memory array shown in FIG. 5 when performing the erase operation according to an embodiment of the invention.
Figure 14:
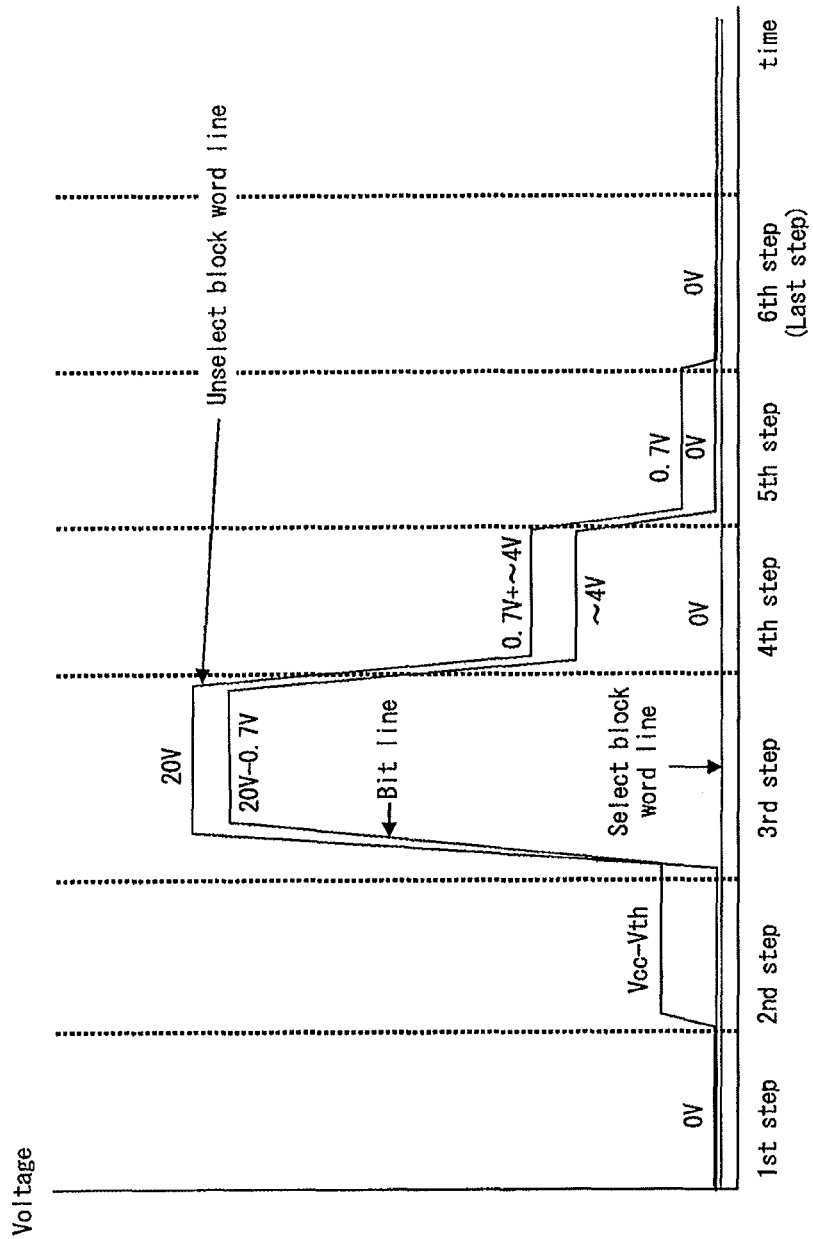
FIG. 14 is a timing diagram of the voltage applied to a word line of a select block, the word line of an un-select block of the portion of the memory array shown in FIG. 5 when performing an erase operation according to an embodiment of the invention.

FIGS. 13 and 14 show timing diagrams of the applied voltages when performing the erase control method according to an embodiment of the invention. FIG. 13 is a timing diagram of the VBL_EVEN, ER_BIAS and WELL. FIG. 14 is a timing diagram of the voltages applied to the word line of the selected block, and the word line of an unselected block and bit line (both of selected and unselected). In both of FIGS. 13 and 14, the vertical axis indicates voltage and the horizontal axis indicates time, with the V_PN forward being assumed to be 0.7 volts.

Referring to FIG. 13, the ER_BIAS outputs the voltage for turning ON the high voltage transistor 30 of the decoder unit 3 in the first step. Here, for example, the assumption is that six volts is applied to the high voltage transistor 30. Then the voltage applied to the high voltage transistor 30 is decreased from six volts to Vcc in the second step. This is for turning OFF the high voltage transistor 30 of the decoder unit 3 in order to shut off an erase voltage if applied. This state is maintained until the sixth step when the erase control is completed, followed by applying six volts again for turning ON the high voltage transistor 30 of the decoder unit 3, thus returning to the original state.

Here, the VBL_EVEN is applied to a first column decoder transistor of an even-numbered bit line as an example. The VBL_EVEN outputs a Vcc in the first step that is a standby state, while it first outputs a Vpre for maintaining the first column decoder transistor 31 in the ON state during performance of the erase control in the second step. Here, the Vpre is assumed to be three volts. Then in the third step, an erase voltage of, for example, twenty volts, is applied to the well 43, and the voltage of the VBL_EVEN is also increased to twenty volts plus Vpre (e.g., three volts) by virtue of capacitive coupling with the well 43. When the bit line voltage is clamped at four volts in the fourth step, VBL_EVEN decreases to Vpre (e.g., three volts) plus V_PN forward (e.g., 0.7 volts) plus four volts. The voltage is decreased to Vpre (e.g., three volts) plus V_PN forward (e.g., 0.7 volts) in the fifth step. Eventually, the voltage is decreased to Vpre (e.g., three volts) in the sixth step, followed by the attaining of the state of Vcc in the original first step. The performance of such a control keeps the first column decoder transistor 31 maintaining the gate voltage constantly at no less than the Vcc from the start of an erase control to the completion, thereby making it possible to maintain the ON state throughout all the steps and, therefore, the column decoder transistor 31 is not broken down by the stress of reverse direction bias.

The voltage WELL applied to the well 43 is zero volts in the first and second steps, whereas twenty volts is applied in the third step. In the fourth step, the voltage is decreased to a V_PN forward (e.g., 0.7 volts) plus four volts, followed by decreasing it to a V_PN forward (e.g., 0.7 volts) in the fifth step. Eventually, the WELL is set to zero volts in the sixth step, thus returning to the original state of the first step.

Referring to FIG. 14, a selected word line (which may be part of a "block" of word lines which are selected together for erase) is maintained at zero volts throughout all the steps.

While the bit line is at zero volts in the first step, a voltage that is a result of subtracting the threshold voltage from the power supply voltage (e.g., Vcc−Vth) is applied in the second step by VBL_BIAS control unit 17. When twenty volts is applied to the well 43 in the third step, the voltage on the bit line climbs to a voltage that is a result of subtracting the forward direction voltage from the erase voltage (e.g., twenty volts−V_PN forward (e.g., 0.7 volts)). Then, the voltage is decreased to four volts in the fourth step, then it is decreased to zero volts in the fifth step and maintained at zero volts in the sixth step, followed by returning to the state of the first step.

Meanwhile, an unselected word line (which may be part of an unselected block of word lines) is at zero volts in the first and second steps, an application of twenty volts, which is the erase voltage, to the well 43 causes it to be increased to twenty volts by virtue of a coupling phenomenon with the well 43 in the third step, followed by being decreased to a V_PN forward (e.g., 0.7 volts) plus four volts in the fourth step and to a V_PN forward (e.g., 0.7 volts) in the fifth step. Then, the voltage is decreased to zero volts in the six step, and thus returned to the state of the first step.

As described above, when the erase voltage to the well is decreased, that is, between the fourth step and sixth step, the difference of potentials between the well 43 and bit line is no higher than the V_PN forward, which is well within the breakdown voltage (e.g., about eight volts). In the conventional case, the n-type source or drain area of the gate and bit line are maintained at the potential of twenty volts due to a delay caused by a time constant when the p-type well area is zero volts, resulting in a reverse voltage being applied to a p-n junction part and thus levying a high voltage stress and generating a breakdown phenomenon in the p-n junction part. Such a phenomenon should not occur in the present case, however, thus making it possible to complete the erase control by decreasing the potential of the bit line and well.

Figure 15:
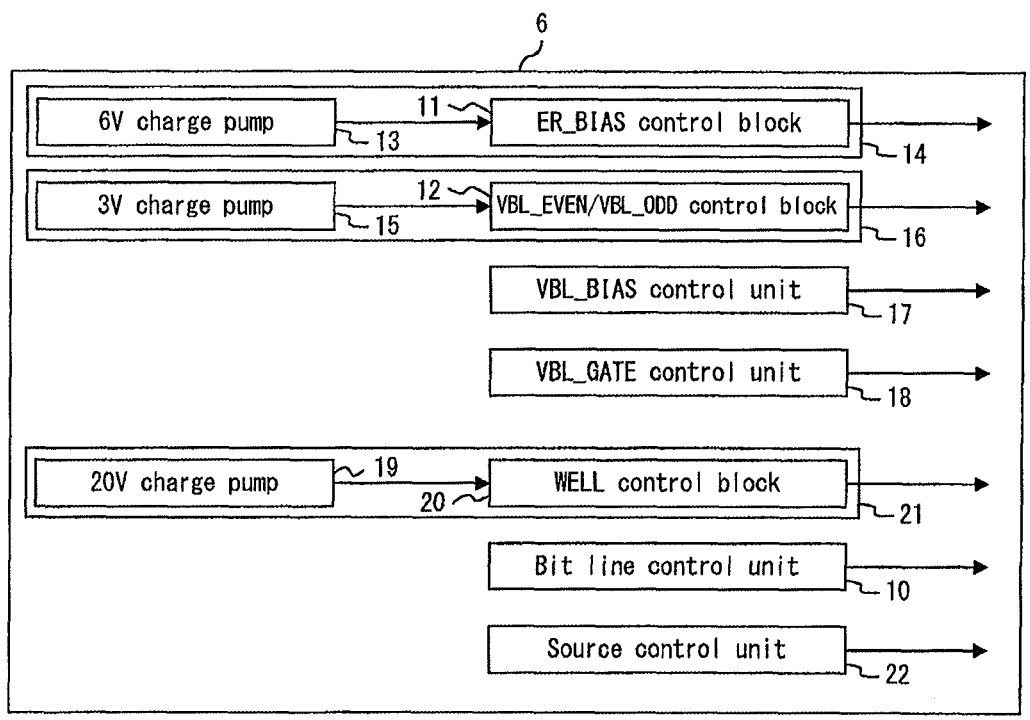
FIG. 15 is a block diagram of an erase control unit according to an embodiment of the invention.

FIG. 15 is a block diagram of an erase control unit 6 embodying an erase control method according to an embodiment of the present invention. FIGS. 16 through 22 show simplified diagrams exemplifying a circuit of each control unit carrying out the erase control method according to an embodiment of the present invention.

The erase control unit 6 of FIG. 15 includes seven control units. Among them, the ER_BIAS control unit 14 includes a six-volt charge pump 13 and an ER_BIAS control block 11. Also, the VBL_EVEN/VBL_ODD control unit 16 includes a three-volt charge pump 15 and a VBL_EVEN/VBL_ODD control block 12. Further, the WELL control unit 21 includes a twenty-volt charge pump 19 and a WELL control block 20.

The function of each of the above control units will now be described with reference to the simplified circuits shown in FIGS. 16-22. Note that the signal input to each control unit shown in the following is output from the state machine 7, which has a counter and outputs a signal to each control unit within the erase control unit 6 in order to shift to, and control, the state of each step of the erase control method according to the embodiment of the present invention shown in FIGS. 7 through 12. Note that counter values of the state machine 7 correspond to each step of the erase control method according to the embodiment of the present invention shown in FIGS. 7 through 12.

Figure 16:
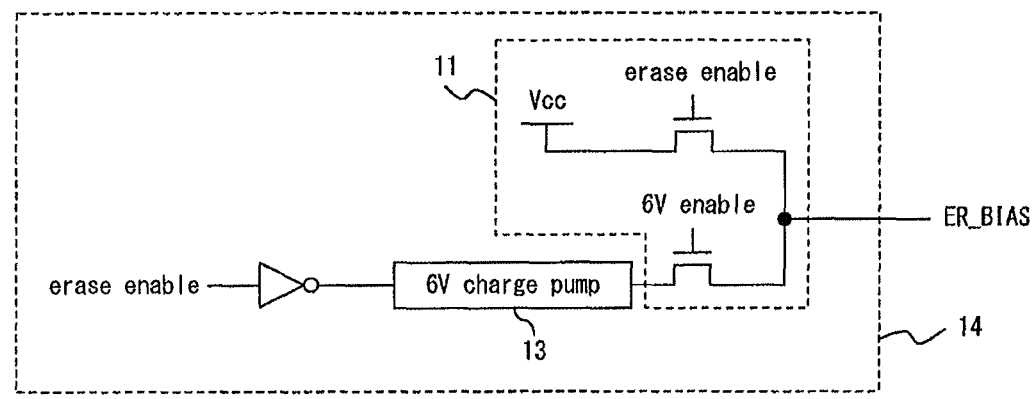
FIG. 16 is a simplified schematic diagram of a bias control unit according to an embodiment of the invention.

First, the ER_BIAS control unit 14 shown in FIG. 16 receives an input of a signal of erase_enable from the state machine 7, and outputs a Vcc as ER_BIAS if the input signal is High (noted as "H" hereinafter), between the High and Low, in the second step. Conversely, if it is Low (noted as "L" hereinafter), as a signal of erase_enable is input by the state machine 7 in the first step, a signal is input into the six-volt charge pump 13 by way of a NOT circuit and six volts is output as ER_BIAS. This makes it possible to perform a control of turning on the high voltage transistor 30 of the decoder unit 3 by using a six-volt output in the first step and turning it off by using a Vcc output in the second step in the event of performing an erase control.

Figure 17:
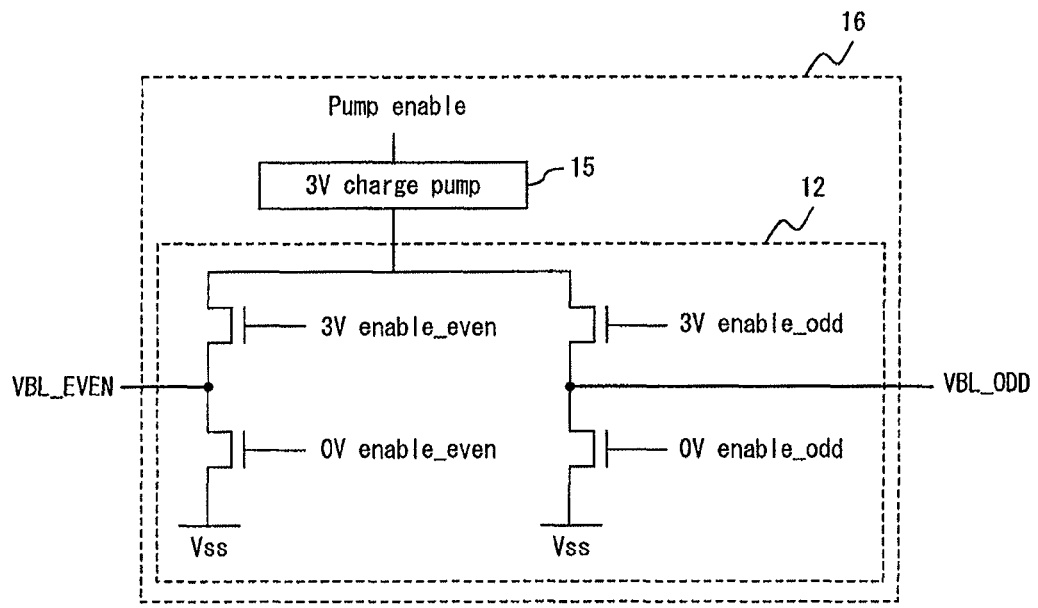
FIG. 17 is a simplified schematic diagram of a control unit according to an embodiment of the invention.

Then, at the VBL_EVEN/VBL_ODD control unit 16 shown in FIG. 17, first, the VBL_EVEN outputs zero volts if a signal of H is input from the state machine 7 to the 0V enable_even, while it outputs three volts by way of the three-volt charge pump 15 if a signal of H is input from the state machine 7 to the 3V enable_even. This makes it possible to pre-charge the column decoder transistor controlled by the EVEN_SELECT with the Vpre (e.g., three volts) in the second step in the event of performing an erase control.

Likewise, the VBL_ODD outputs zero volts if a signal of H is input from the state machine 7 to the 0V enable_odd, while it outputs three volts by way of the three-volt charge pump 15 if a signal of H is input from the state machine 7 to the 3V enable_odd in the second step. This makes it possible to pre-charge the column decoder transistor controlled by the ODD_SELECT with the Vpre (e.g., three volts) in the second step in the event of performing an erase control.

Figure 18:
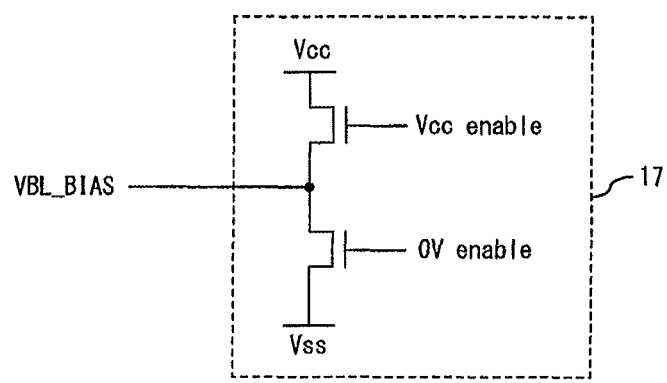
FIG. 18 is a simplified schematic diagram of a bias circuit example according to an embodiment of the invention.

The VBL_BIAS control unit 17 shown in FIG. 18 outputs a Vcc if a signal of H, as VBL_BIAS, is input from the state machine 7 to the Vcc enable in the second step, while it outputs zero volts if a signal of H is input from the state machine 7 to the 0V enable in the fifth step. This makes it possible to apply a Vcc to the bit line in the second step and to decrease the potential of the bit line in the fifth step in the event of performing an erase control.

Figure 19:
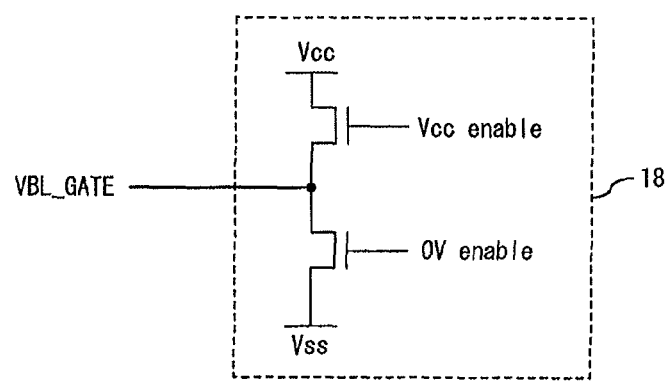
FIG. 19 is a schematic diagram of a gate control circuit according to an embodiment of the invention.

The VBL_GATE control unit 18 shown in FIG. 19 outputs a Vcc as VBL_GATE if a signal of H is input from the state machine 7 to the Vcc enable, while it outputs zero volts if a signal of H is input from the state machine 7 to the 0V enable. This makes it possible to perform a control of turning on the high voltage transistor 41 of the decoder unit 3 by using the output of the Vcc and turning it off by using the output of the zero volts in the event of performing an erase control. The high voltage transistor 41 is put in the On state by the VBL_GATE control unit 18 in the first step and it maintains the On state from the first to the sixth step.

Figure 20:
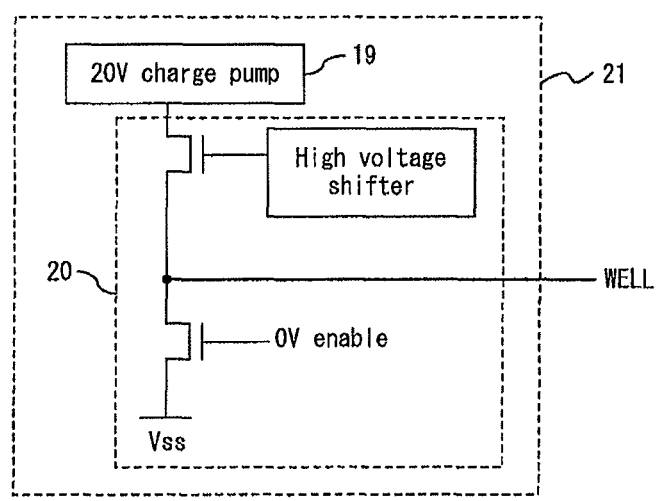
FIG. 20 is a schematic diagram of a well control circuit according to an embodiment of the invention.

The WELL control unit 21 shown in FIG. 20 outputs zero volts to the well if a signal of H is input from the state machine 7 to the 0V enable in the sixth step, while it outputs twenty volts to the well by way of the twenty-volt charge pump 19 if a signal is input from the state machine 7 to the High voltage shifter in the third step. This makes it possible to perform a control of applying the erase voltage of twenty volts to the well 43 in the third step and decreasing the potential of the well in the sixth step in the event of performing an erase control.

Figure 21:
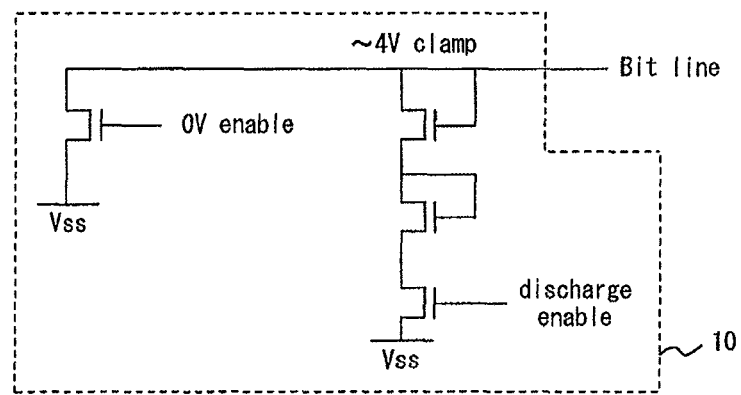
FIG. 21 is a schematic diagram of a bit line control circuit according to an embodiment of the invention.

The bit line control unit 10 shown in FIG. 21 clamps the potential of the bit line at four volts by coupling the bit line to Vss through two MOS transistors, which are diode-connected if a signal of H is input from the state machine 7 to the discharge enable in the fourth step shown in FIG. 10. The bit line control unit 10 connects the bit line directly to Vss if a signal of H is input from the state machine 7 to the 0V enable in the fifth step of the erase control shown in FIG. 11. This makes it possible to perform a control of clamping the voltage of the bit line at four volts followed by decreasing it to zero volts in the fifth step in the event of performing an erase control.

Figure 22:
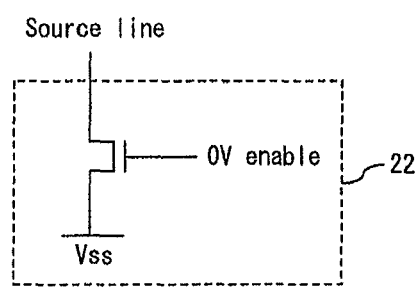
FIG. 22 is a schematic diagram of a source line control circuit according to an embodiment of the invention.

The source line control unit 22 shown in FIG. 22 connects the source line to the Vss if a signal of H is input from the state machine 7 to the 0V enable. This makes it possible to set the source line to zero volts. The source line is put in the floating state in the first step and it is set to zero volts after the completion of the erase control.

The configuration of the erase control unit makes it possible to perform the erase control as shown in FIGS. 7 through 12 and FIGS. 13 and 14, and to perform the control for avoiding a high voltage stress associated with a breakdown phenomenon at the time of erasing data in the case of forming a column decoder unit, which is comprised by a semiconductor storage apparatus, on the well.

Also enabled is a forming of the column decoder transistor in the same well as a memory cell in a manner to possess the same voltage resistance in the same size, thereby making it possible to improve the degree of integration of the memory cell by minimizing a bit line interval that is determined by the form and size of the memory cell.

Furthermore, there is no longer a necessity to improve the voltage resistance of the column decoder transistor, making it possible to form the column decoder transistor in the same size as that of a memory cell, thereby bringing forth the benefit of decreasing the failure ratio of the column decoder unit as a result of generating more room for lithography.

Note that the respective circuits of the ER_BIAS control unit 14, VBL_EVEN/VBL_ODD control unit 16 and WELL control unit 21 can be mutually shared by slightly modifying the output voltage of the charge pump and circuit configuration.

Further, the respective circuits of the VBL_BIAS control unit 17, VBL_GATE control unit 18, bit line control unit 10 and source line control unit 22 can be mutually shared by slightly modifying the circuit configuration.

Figure 23:
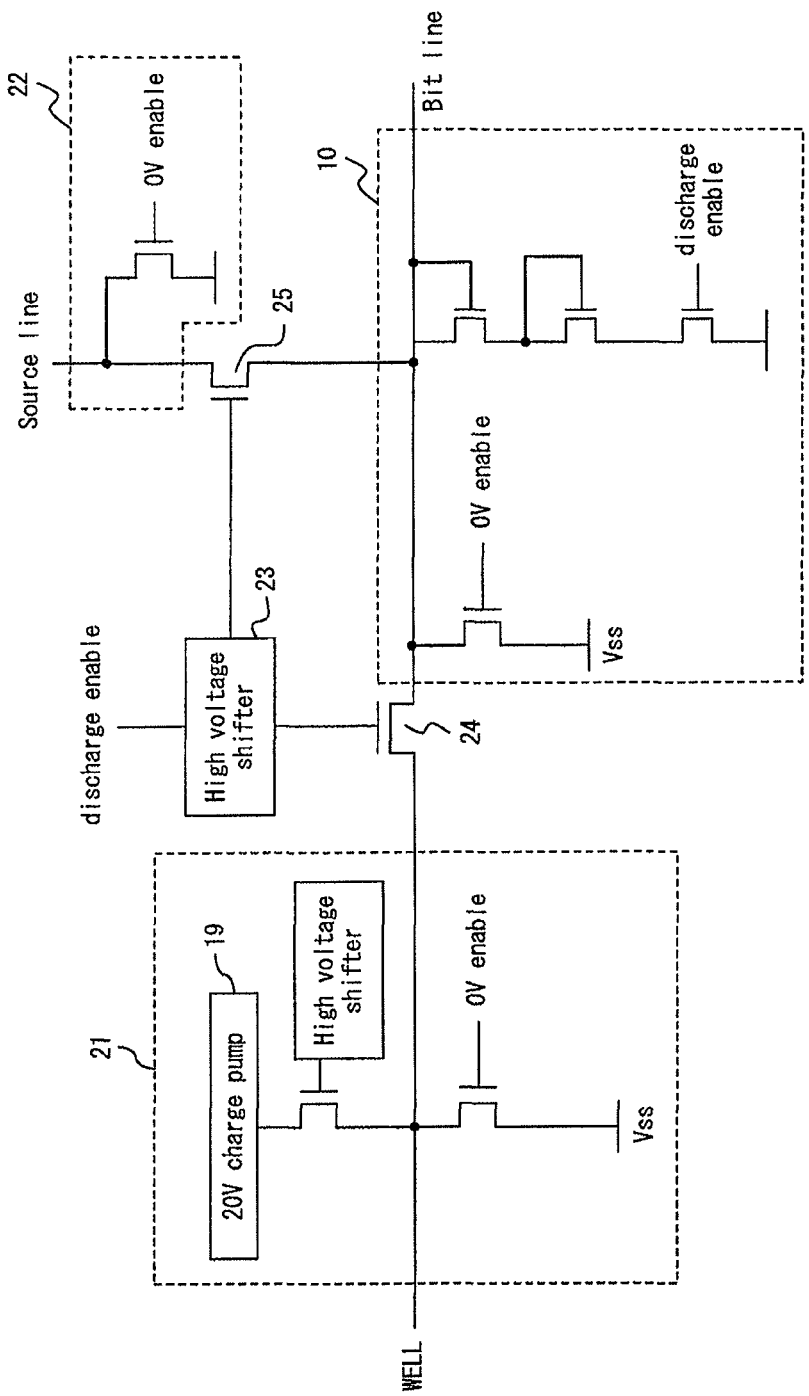
FIG. 23 is a diagram exemplifying a part of each of the circuits of the well control circuit of FIG. 20, the bit line control circuit of FIG. 21 and the source line control circuit of FIG. 22 according to an embodiment of the invention.

FIG. 23 is a diagram exemplifying a part of each of the circuits of the WELL control unit 21, bit line control unit 10 and source line control unit 22 embodying an erase control method according to an embodiment of the present invention. Note that, in this embodiment, the respective circuit examples of the ER_BIAS control unit 14 (shown in FIG. 16), VBL_EVEN/VBL_ODD control unit 16 (shown in FIG. 17), VBL_BIAS control unit 17 (shown in FIG. 18) and VBL_GATE control unit 18 (shown in FIG. 19) are common to the previous embodiment. Further, the transistors shown in FIGS. 16 through 22 are all high voltage transistors.

The respective circuits of the WELL control unit 21, bit line control unit 10 and source line control unit 22 which are shown in FIG. 23 are similar to those shown in FIGS. 20, 21 and 22, in which the characteristic is that the power output unit, outputting power to the well, of the WELL control unit 21 and the source line of the source line control unit 22 are connected to the bit line. In the connection parts to the respective bit lines, transistors 24 and 25 are placed by way of the High voltage shifter 23 so that an application of the erase voltage to the well in the third step is followed by short-circuiting the well and source line to the bit line if a signal of H is input from the state machine 7 to the discharge enable in the fourth step. This causes the well, bit line and source line to all decrease the voltage simultaneously in the fourth step and thereafter. This should decrease the possibility that the difference of potentials between the well and bit line, more specifically, in the p-n junction part of the transistor, will exceed the breakdown voltage and generate a reverse bias.

The control apparatus and control method for an erase voltage is not limited to a nonvolatile semiconductor storage apparatus. Also, the control apparatus and control method for an erase voltage can be applicable to a control circuit for performing control to limit the difference in potentials between a well and a bit line under the breakdown voltage of a transistor in the event of applying an erase voltage to a semiconductor storage apparatus.

The configuration of an erase control unit as described above makes it possible to perform control to avoid a high voltage stress associated with a breakdown phenomenon at the time of erasing data in the case of forming a column decoder unit comprised by a semiconductor storage apparatus on a well.

The implementation of an erase control method as described above in detail makes it possible to perform control to avoid a high voltage stress associated with a breakdown phenomenon at the time of erasing data in the case of forming a column decoder unit comprised by a semiconductor storage apparatus on a well, thus enabling the attainment of a semiconductor storage apparatus that can endure repeated usage. This in turn can enable a further reduction in the bit line interval of a semiconductor storage apparatus and also a large reduction in a failure ratio of failures such as short-circuiting, which has conventionally occupied a large part of pitch failure, thereby enabling a further miniaturization and a higher level of integration.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A memory device, comprising:
a plurality of serially-coupled memory cells fabricated in a well, each of the plurality of serially-coupled memory cells including a respective memory cell transistor;
a bit line coupled to the plurality of serially-coupled memory cells;
an additional transistor in the well, the additional transistor coupled between the bit line and one of the memory cell transistors, the additional transistor having a breakdown voltage;
an erase control unit configured to apply an erase voltage to the well; and
a bit line control unit coupled to the bit line and configured to bias the bit line to a non-zero voltage less than the erase voltage, the difference in potentials between the non-zero voltage and the erase voltage being less than the breakdown voltage of the additional transistor.

2. The memory device of claim 1, wherein the additional transistor is configured to couple the memory cells to a data register.

3. The memory device of claim 2, wherein the additional transistor is a column decoder transistor.

4. The memory device of claim 1, further comprising:
a high voltage transistor coupled between the additional transistor and the data register, the high voltage transistor electrically isolated from the well.

5. The memory device of claim 1, wherein the erase control unit is further configured to decouple the erase voltage from the well.

6. The memory device of claim 1, wherein the additional transistor is capacitively coupled to the well.

7. The memory device of claim 1, wherein the memory device is a NAND flash memory device.

8. A method comprising:
charging a well coupled to a bit line such that a voltage of the well is an erase voltage;
partially discharging the voltage of the well;
clamping a voltage of the bit line such that the difference between the voltage of the bit line and the voltage of the well is less than a breakdown voltage of a p-n junction in the well; and
further discharging the voltage of the well.

9. The method of claim 8, wherein the voltage of the bit line is clamped at a non-zero voltage.

10. The method claim 8, wherein said partially discharging comprises applying a discharge voltage to the bit line.

11. The method claim 8, further comprising:
pre-charging the bit line, before said charging the well, such that the voltage of the bit line is equal to a supply voltage.

12. The method claim 8, wherein said charging the well also charges the bit line such that the bit line voltage is the erase voltage minus a forward bias voltage.

13. The method claim 8, wherein said further discharging occurs after said clamping.

14. The method of claim 13, wherein said claiming occurs after said partially discharging.

15. A method of erasing memory cells in a memory array, the method comprising:
charging a well such that a voltage of the well is a first voltage, wherein the well comprises a plurality of memory cells fabricated therein;
initiating a discharge of the voltage of the well;
biasing a bit line coupled to the plurality of memory cells such that a difference between a voltage of the bit line and the voltage of the well is less than a breakdown voltage of a transistor in the well, wherein the transistor is coupled between the bit line and one of the plurality of memory cells; and
further discharging the voltage of the well.

16. The method of claim 15, wherein the voltage of the bit line is biased to a non-zero voltage during discharge of the voltage of the well.

17. The method claim 15, wherein the voltage of the well is discharged to zero volts.

18. The method claim 15, wherein the transistor is a column decode transistor.

19. The method claim 18, wherein the plurality of memory cells comprise memory cell transistors and the column decode transistor has identical operating characteristics as the memory cell transistors.

20. The method claim 18, wherein the column decode transistor is configured to decrease the voltage of the bit line through a direct discharge path.

21. The method claim 15, wherein the voltage of the bit line is less than the first voltage.

22. The method claim 15, wherein the memory cells comprise n-channel field effect transistors and the well is a p-type well.

23. The method claim 15, wherein the plurality of memory cells comprise a plurality of floating gates, and wherein said charging the well causes a plurality of electrons on the plurality of floating gates of the plurality of memory cells to tunnel into the well.

* * * * *

UNITED STATES PATENT AND TRADEMARK OFFICE
CERTIFICATE OF CORRECTION

PATENT NO. : 8,503,249 B2  
APPLICATION NO. : 13/194813  
DATED : August 6, 2013  
INVENTOR(S) : Shigekazu Yamada et al.

Page 1 of 1

It is certified that error appears in the above-identified patent and that said Letters Patent is hereby corrected as shown below:

In the Claims

In column 15, line 47, in Claim 10, after "method" insert -- of --.

In column 16, line 1, in Claim 11, after "method" insert -- of --.

In column 16, line 5, in Claim 12, after "method" insert -- of --.

In column 16, line 8, in Claim 13, after "method" insert -- of --.

In column 16, line 27, in Claim 17, after "method" insert -- of --.

In column 16, line 29, in Claim 18, after "method" insert -- of --.

In column 16, line 31, in Claim 19, after "method" insert -- of--.

In column 16, line 35, in Claim 20, after "method" insert -- of --.

In column 16, line 38, in Claim 21, after "method" insert -- of --.

In column 16, line 40, in Claim 22, after "method" insert -- of --.

In column 16, line 43, in Claim 23, after "method" insert -- of --.

Signed and Sealed this  
Twenty-ninth Day of October, 2013

Teresa Stanek Rea  
*Deputy Director of the United States Patent and Trademark Office*